(12) United States Patent
Widdershoven

(10) Patent No.: US 7,529,142 B2
(45) Date of Patent: May 5, 2009

(54) DATA PROCESSING DEVICE WITH A WOM MEMORY

(75) Inventor: Franciscus Petrus Widdershoven, Eindhoven (NL)

(73) Assignee: NXP B.V., Eindhoven (NL)

( * ) Notice: Subject to any disclaimer, the term of this patent is extended or adjusted under 35 U.S.C. 154(b) by 1598 days.

(21) Appl. No.: 10/023,165

(22) Filed: Dec. 18, 2001

(65) Prior Publication Data

US 2002/0136068 A1    Sep. 26, 2002

(30) Foreign Application Priority Data

Dec. 20, 2000  (EP)  ................................. 00204651

(51) Int. Cl.
*G11C 29/00*    (2006.01)
*G06F 13/00*    (2006.01)

(52) U.S. Cl. ....................... 365/200; 711/103

(58) Field of Classification Search .................. 711/103
See application file for complete search history.

(56) References Cited

U.S. PATENT DOCUMENTS 4,691,299 A * 9/1987 Rivest et al. ........... 365/189.01
6,069,827 A * 5/2000 Sinclair ................... 365/185.29
6,772,274 B1 * 8/2004 Estakhri ........................ 711/103

FOREIGN PATENT DOCUMENTS

| EP | 0863513 A2 | 9/1998 |
|---|---|---|
| WO | WO8303912 | 11/1983 |

\* cited by examiner

*Primary Examiner*—Hyung S Sough
*Assistant Examiner*—Mardochee Chery

(57) ABSTRACT

A data processing device has a memory with writeable and erasable locations, such as a flash memory. The memory locations are store WOM codewords (Write Once Memory codewords in which successive generations of data can be encoded by setting bits from zero to one only). A data encoder encodes a received data value in a new codeword from the WOM code, as a function of the received data value and a previous codeword stored in the currently selected location. When the WOM codeword is exhausted the data encoder selects a new currently selected location from a logical series of locations and stores the new codeword in the new currently selected location. When all locations are exhausted a reset circuit resets a content of the locations in the logical series. On reading the currently selected location is read and decoded.

4 Claims, 2 Drawing Sheets

DATA PROCESSING DEVICE WITH A WOM MEMORY

The field of the invention is a data processing device with a memory.

Some types of memory suffer from wear. Data stored in memories that suffer from wear can only be changed a limited number of times before the stored data becomes unreliable. In current flash memory for example, the data can only be changed some 100000 times before there is significant wear.

In chapter 3 of a publication by Intel, titled "Flash Data Integrator (FDI) Users Guide", published in 1999, in particular section 3.6 it has been described how the effective number of times that data can be written into a flash memory can be increased. This is done by providing a block of flash memory locations for the data. When the data is written at successive points in time, the data is written to successively different ones of the locations. When the data is read, data from the most recently written location is returned. When all locations of the block have been written, the locations of the block are erased and writing can start again from the first location of the block.

Programmable read only memories have locations in which data-bits can only be changed from logic 0 to logic 1. In programmable read only memories it is not possible to change data-bits back from 1 to 0. (This is in contrast to Flash Memory, where the data in a block can be erased as a whole).

From U.S. Pat. No. 4,691,299 it is known to use a so-called WOM code to write data into a programmable read only memory. A WOM code allows successive generations of data values to be encoded with the bits of the same memory location, in such a way that no more than one change of value is required for any bit when a succession of data values is encoded. A WOM code provides codewords that represent data values. Several different codewords are available to represent the same data value. To realize this, the size location needed for the codewords is larger than the size needed for writing a data value itself. When codewords for different data values have to be written to memory one after the other, the availability of several codewords for the same data value facilitates selection of a codeword that can be written into memory without changing back bits that have been changed to write preceding codewords, i.e. without requiring write operations that are impossible in a programmable read only memory.

To promote the availability of codewords, the WOM code is such that a second data value can be coded after a first data value and vice versa without changing back bits. That is, the code contains a first and second codeword that represent the first data value and a third and fourth codeword that represent the second data value. The third codeword can be written over the first codeword without changing back bits and the second codeword can be written over the fourth codeword without changing back bits. The bits that have been changed initially to write the first or fourth codeword for the first and second data value respectively also differentiate the subsequent third and second codeword from other codewords, ensuring efficient use of code bits.

Amongst others, it is an object of the invention to provide a data processing circuit with a memory in which wear is reduced while making efficient use of storage locations.

The data processing circuit according to the invention is set forth in Claim 1. By using a WOM code, it is possible to write several data values to the same location, without changing bits more than once, before it is necessary to start writing to the next location. The locations need to be reset only when a whole series of locations has been exhausted in this way.

Preferably, the data processing circuit has a plurality of such series of locations, each corresponding to a different logical address. When a processor addresses a series with a logical address, data is written or read in the currently active one of the locations of the series that is addressed by the logical address. Preferably, the memory comprises a matrix of rows and columns, where each row can be addressed and reset as a whole, the series of locations comprising an integer number of at least one of such rows.

In an embodiment, the data processing circuit reads or writes a logical word to a logical address. The processing circuit splits the logical word into a plurality of sub-words. Each logical address corresponds to a plurality of series of locations. The processing circuit reads or writes each sub-word to a respective one of the series of locations that corresponds to the logical address. When the current location in the series of locations for a particular sub-word is exhausted, the current location in that series of locations is changed to a next available location, independent of changes in the current location in series for other sub-words. This provides a further increase in storage efficiency. If a whole word comprising all sub-words were written in one location, a new location would be needed as soon as the storage capacity for one sub-word was exhausted. By using different series of locations for different sub-words, a new location is needed in only one series. When a large number of words is written successively, changes of location will be statistically distributed over different series, so that on average many more words can be written than possible in a single series of locations.

In a further embodiment, the data processing circuit comprises an encoder and a decoder for an error correcting code. The data processing circuit splits the logical word into a plurality of partial words and encodes each partial word into a respective error correcting word. Different bits from each error correcting word are distributed over different sub-word that are stored in different series of locations. Thus, an error in the data retrieved from a single location will only cause a limited number of bit errors in any individual error correcting word. This limited number of bit errors can be corrected using the error correcting code.

These and other advantageous aspects of the electronic circuit according to the invention will be described using the following figures.

Figure 1:
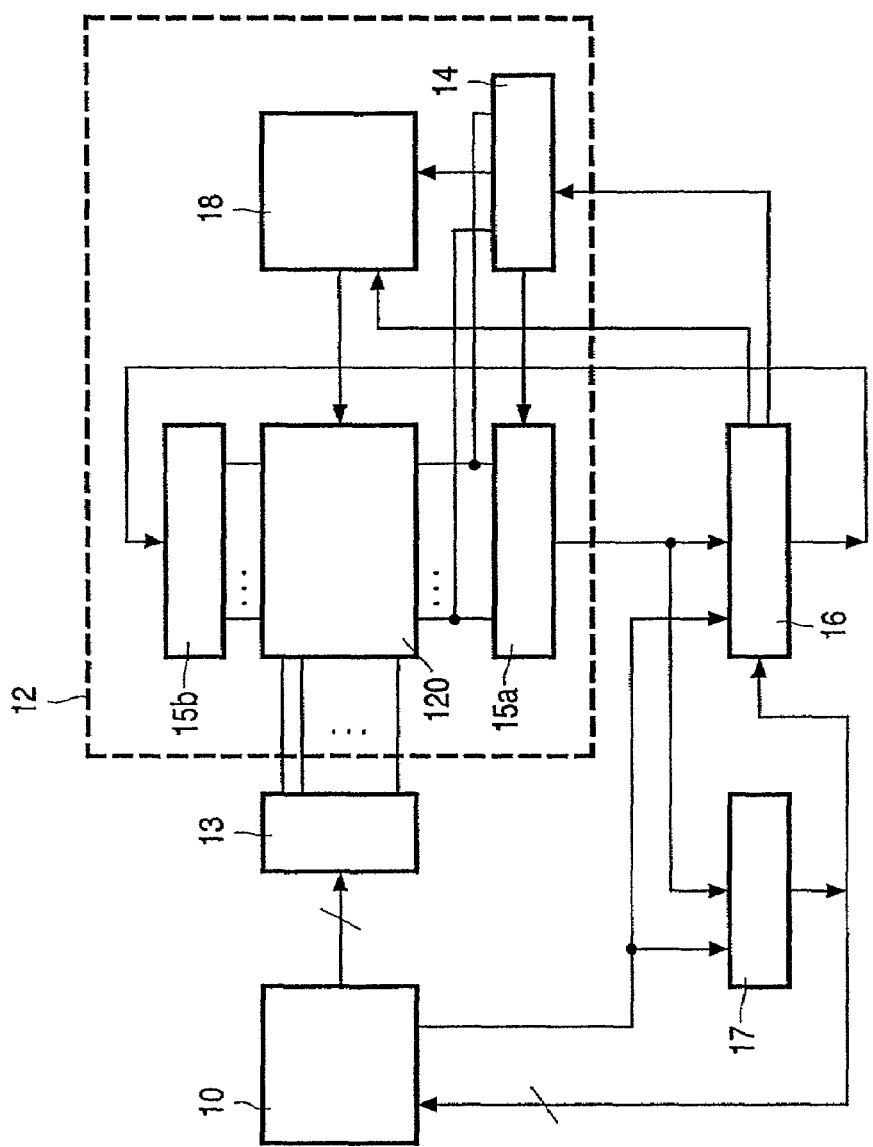
FIG. 1 shows a data processing circuit

FIG. 1 shows a data processing circuit. The data processing circuit contains a processor 10, a memory matrix unit 12, a row address decoder 13, a location selector 14 and a decoder 17. The memory matrix unit 12 contains a matrix of memory cells 120, a multiplexer 15a, a demultiplexer 15b, an encoder 16 and a memory control circuit 18. The processor 10 has an address output coupled to the row decoder 13, which in turn has wordline outputs each coupled to the select inputs of a row of the matrix of memory cells 120. The memory cells 120 have data outputs coupled to the location selector 14 and multiplexer 15a. The location selector has an output connected to the multiplexer 15a and the demultiplexer 15b. The multiplexer 15a has an output coupled to the decoder 17, which in turn has an output coupled to the processor 10.

The encoder 16 has inputs coupled to a control output of the processor 10, a data output of the processor 10 and to the output of the multiplexer 15a. The encoder 16 has outputs coupled to the demultiplexer 15b, location selector 14 and the memory control circuit 18. The location selector 14 has an output coupled to the memory control circuit 18. The memory control circuit 18 has control output coupled to memory cells 120. Memory control circuit 18 controls whether the memory matrix 120 reads data, writes logic 1 information to selected memory cells or resets (writes 0 to) a row of memory cells.

In a typical example, the memory cells 120 are rewriteable, non-volatile memory cells, organized with the control circuit 18 e.g. in the form of an EEPROM or a flash-memory in which logic 1 data can be written into memory cells individually and in which erasing (writing logic 0) can performed to a row of memory cells at a time. On writing such a memory suffers from wear: the memory becomes unreliable after writing too often. Therefore, it is desirable to reduce the number of time new data needs to be written. This is made possible by the use of WOM codes to write data, and the number of times new data needs to be written is further reduced by using a number of locations with the same memory address.

In operation processor 10 outputs successive address and data values in a series of write operations. Each address value is supplied to row decoder 13, which in response outputs a selection signal to memory matrix unit 12. Memory matrix unit 12 serves to read out and/or update a current codeword that represents data for the address value.

Memory matrix unit 12 contains two or more locations each for storing a codeword for the address value, one of the locations being the current location in which the currently valid codeword is stored. In case of reading memory matrix unit 12 selects the currently valid location and decodes the codeword stored in it. In case of writing, memory matrix unit 12 selects the currently valid location, and if possible forms a new codeword that can be stored in the currently valid location by setting bit locations that have not yet been set in that location. If this is not possible, memory matrix unit 12 updates the currently valid location and writes a new codeword to the new currently valid location.

In memory matrix unit 12, the selection signals from row decoder 13 select an addressed one of the rows of memory matrix 12. In response, memory cells 120 in the selected row read out data stored in these cells. Groups of the memory cells are organized as (logical) locations, each location comprising a number of memory cells from the row, that together store a codeword. Location selector 14 determines which of the locations stores a valid codeword and provides a signal to multiplexer 15a to pass the data from that location. Conversely, under control of memory control circuit 18 data may be written to the selected location via demultiplexer 15b. In principle, demultiplexer 15a can write data only in one direction, e.g. from logic 0 to 1, setting bits stored in memory cells of the selected location to 1, not resetting any bits to 0.

Encoder 16 receives the codeword from the memory matrix unit 12 and a new data value from processor 10, together with a control signal that signals that this new data value should be written into memory matrix 12. Encoder 16 generates a codeword representing the new data value.

The codeword depends on the previous codeword addressed by the address value that accompanies the data value, as received from multiplexer 15a. If possible, encoder 16 selects a codeword that represents the data value and contains logical ones at all bit positions where the previous codeword has logical ones. If encoder 16 finds such a codeword, that codeword is supplied to demultiplexer 15b, which in turn supplies the codeword to the location of the memory matrix 120 that is selected by row decoder 13 and location selector 14.

Encoder 16 then signals control circuit 18 to control memory matrix so that logical ones are written into this location at the positions where the new codeword contains logical ones and the previous codeword did not yet contain logical ones. Table I gives an example of a 3 bit code word that encodes two data bits. In the left most column, the predecessor codes are given as output by multiplexer 15a. The topmost row shows the data value from processor 10 that is to be encoded. The entries of the table show the new code words output from encoder 16 for particular combinations of a previous code word and a data value. "X" indicates that the codeword is exhausted, i.e. that the encoder cannot find an appropriate codeword.

An encoder that supports this example may be realized for example using a ROM that uses the data values and previous code words as address and stores the new codewords at the relevant locations. Alternatively, logic gates may be used to realize the table.

TABLE I

|     | 00  | 01  | 10  | 11  |
| --- | --- | --- | --- | --- |
| 000 | 000 | 001 | 010 | 100 |
| 001 | X   | 001 | 101 | 011 |
| 010 | X   | 110 | 010 | 011 |
| 100 | X   | 110 | 101 | 100 |
| 011 | X   | X   | X   | 011 |
| 101 | X   | X   | 101 | X   |
| 110 | X   | 110 | X   | X   |
| 111 | X   | X   | X   | X   |

If encoder 16 cannot find an appropriate codeword (entry "X" in table I), encoder 16 signals memory control circuit 18 to write to the selected location a codeword that indicates that the location is no longer in use (e.g. 111 in the example of the table). In this case, encoder 16 subsequently signals location selector 14 to select the location that logically follows the originally selected location (e.g. the next three bits in the addressed row of memory matrix 120) and encoder 16 generates an initial codeword for the data value (according to the row that starts with the codeword 000 in the example of table I). This initial codeword is written to the newly selected location in memory matrix unit 12. If location selector 14 has selected the logically final location and encoder signals it to select the logically following location, location selector 14 signals the memory control circuit 18 to clear the row addressed by the address value. Location selector 14 selects a logically initial location. The initial codeword is then written in the logically initial location.

Location selector 14 determines the location that has the lowest rank in the logic order of locations from matrix 120 and does not contain a codeword that indicates that the location is no longer in use (e.g. is not 111).

When processor 10 signals that it only wants to read at the supplied address the content of the corresponding memory is read out but not changed. In this case decoder 17 decodes the codeword received from multiplexer 15a and supplies the resulting data value to processor 10. Table II shows an example of the relation between codewords and data words as provided by decoding. This relation corresponds to the encoding of Table I

TABLE II

| code | 000 | 001 | 010 | 011 | 100 | 101 | 110 | 111 |
| --- | --- | --- | --- | --- | --- | --- | --- | --- |
| data | 00 | 01 | 10 | 11 | 11 | 10 | 01 | — |

Decoding may be realized using a ROM memory, using the codeword as address, with the decoded data stored at the various memory locations addressed by the codewords. Alternatively decoding may be realized using a circuit of logic gates. For example, one could associate a two bit vector with each of the bits of the codeword (11, 10 and 01 for the first, second and third bit from the left respectively), and compute the bit-wise exclusive-or of the vectors whose corresponding code bit equals 1. In the example, a codeword 101 for example would lead to computation of the bit-wise exclusive or of 11 and 01, resulting in 10.

Location selector 14 may be realized in various ways. In a preferred embodiment, location selector 14 inspects the content of the selected row in memory matrix 12 and selects a location that is flanked by (1) a location with a codeword that indicates that that location is no longer in use (e.g. the codeword 111) and (2) a location that has the initial codeword value (e.g. 000). If the first memory location does not indicate that this location is longer in use, that first location is selected. If all but the last memory location indicate that they are no longer in use, the last memory location is selected.

Alternatively, one could use a counter to indicate the current location. However, such a counter would be required for every row of the matrix (in case each row corresponds to one address. More generally, a counter would be required for every set of locations that is used for encoding a data value). The counter would have to be non-volatile. The counter could be stored in locations of the row that are specially reserved for this purpose. However, this would cost additional locations and moreover it entails the risk that a single memory error in the counter would lead to data errors. By using the content of two or more flanking locations single memory errors can be detected. In a mixed embodiment, one may initially select the currently valid location as described from codewords in the memory matrix 120 and provide a respective volatile memory counter for each row, the counters storing pointer to the selected locations selected from the codewords. Thus, selection of locations can be speeded up, without losing the advantages of non-volatile storage.

As shown in FIG. 1, the locations in each row of memory cells correspond to a respective address supplied by the processor 10. Alternatively, one row might correspond to two or more such addresses. In this case, address bits from the processor 10 will be supplied to location selector 14 to indicate which of the columns are selected. In another alternative, an address might correspond to locations from two or more rows. In this case, location selector 14 will supply part of the address to address decoder 13 in addition to the address supplied by processor 10. Initially, location selector 14 will supply an initial address part value, but when location selector detects that the currently valid location is not in the selected row, location detector will select a subsequent address part value and so on, until it finds the row with the currently selected location. Of course, when a counter is used to indicate the currently active location, address part to address the relevant row can be derived directly from the counter value.

Figure 2:
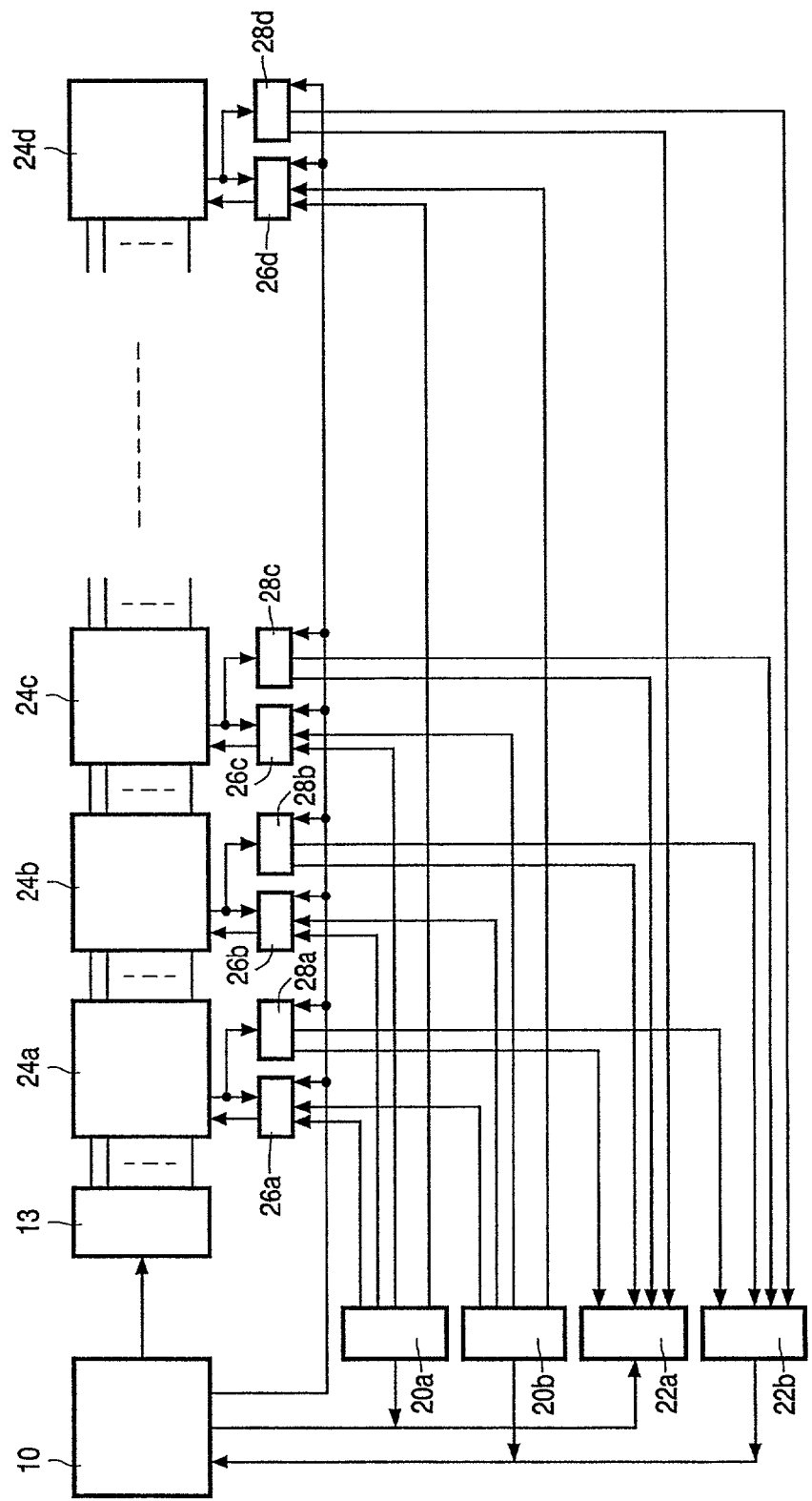
FIG. 2 shows a further data processing system.

FIG. 2 shows a further data processing system. In addition to the components of the system of FIG. 1, this system contains a first and second error correcting encoder 20a-b and a first and second error correcting decoder 22a-b. The system contains a plurality of memory matrix units 24a-d and a plurality of WOM encoders 26a-d and WOM decoders 28a-d. The address decoder 13 is coupled to the row select lines of the memory matrix units 24a-d. The codeword outputs of the memory matrix units 24a-d are coupled to the WOM encoders 26a-d and the WOM decoders 28a-d. The codeword output of each WOM encoder is coupled to the codeword input of its memory matrix unit 24a-d. The data input/output of the processor 10 is coupled to the WOM encoders 26a-d and the WO decoders 28a-d via the error correcting encoders 20a-b and the error correcting decoders 22a-b respectively. Each of the error correcting encoders 20a-b has outputs coupled to each of the WOM encoders 26a-d. Each of the error correcting decoders 22a-b has outputs coupled to each of the WOM decoders 28a-d.

In operation, the matrix memory units 24a-d, WOM decoders 26a-d and WOM encoders 28a-d operate as described for FIG. 1, using its own location selector to select the currently valid location in its own memory matrix (the currently valid locations in different memory matrix units 24a-d are independent of one another). The error correcting encoders 20a-b each encode part of a dataword from processor 10 in a respective EC-codeword form an error correcting code. That is, these encoders produce EC codewords from which the part of the dataword from the processor can be recovered even if the EC-codeword is damaged by a limited number of errors. Each WOM encoder 26a-d generates a WOM codeword that encodes a part of the EC-codewords from the different error correcting encoders 20a-b. Similarly, each error correcting decoder 22a-b decodes and corrects the dataword using decoded information from the various WOM decoders 28a-d.

When one of the memory matrix units 24a-d produces an error, this error will be divided over the error correcting decoders 22a-b. The device is designed so that each error correcting decoder 22a-b is able to correct at least as many errors as are produced when the decoded data from one of the WOM decoders is completely erroneous. For example, in the WOM code shown in tables I and II, each memory matrix unit 24a-d is used to store two bits of information in a WOM. These bits have been encoded using one bit from each of the error correcting encoders 20a-b. On decoding two WOM decoded bits from a memory matrix unit 24a-d are formed by each WOM decoder 28a-d. Each bit is fed to a respective one of the error correcting decoders 22a-b. Thus, if one of the memory matrix units 24a-d produces an error, two of the decode bits will be in error, but each error correcting decoder 22a-d will receive only one erroneous bit, which can be easily corrected.

It will be understood that FIG. 2 merely shows an example: a larger number of error correcting encoders 20a-b or decoders 22a-b may be used when more bits are encoded in a WOM location. With larger or smaller EC-codewords, a larger or smaller number of memory matrix units may be used. When the EC codewords have a larger error correction capacity, more bits from the same EC codeword may be stored in the same memory matrix unit 24 a-d.

The device has been described here in terms of multiplexers, encoders. decoders etc. shown as circuit modules. In principle, circuits designed specially for each function, which are known per se from the art, may used to implement these circuit modules. However, it will be understood that, without deviating from the invention, the function of any one or any combination of these modules can also be implemented with a suitably programmed general purpose computer circuit.

The invention claimed is:

1. A data processing device comprising
   a memory having locations, each capable of storing a WOM codeword from a WOM code;
   a memory selector for selecting a currently selected location of a logical series of the locations;
   a data encoder that encodes a received data value in a new codeword from the WOM code, as a function of the received data value and a previous codeword stored in the currently selected location, the data encoder causing the currently selected location to be changed to a next one in the logical series when the WOM code is exhausted, the data encoder storing the new codeword in the currently selected location;

a reset circuit for resetting a content of the locations in the logical series, the reset circuit being triggered when the WOM code is exhausted for all the locations of the logical series.

2. A data processing device according to claim 1, wherein the memory selector is arranged to determine the currently selected location from a content of the locations, so that the currently selected location has an immediate predecessor location, if any, that contains a codeword indicating that the location is full and an immediate successor location, if any, that contains an initial codeword value produced by resetting.

3. A data processing device according to claim 1, comprising
   an input for receiving a dataword;
   an error correcting encoder, arranged to form N data values, each data value at least representing a respective part of the dataword encoded in an error correcting code;
   the memory selector being arranged to select N currently selected locations, each of a respective logic series of the locations;
   the data encoder encoding the data values in N respective new codewords from the WOM code, each as a function of a respective one of the data values and a previous codeword stored in the currently selected location of a respective one of the logic series, the data encoder causing the currently selected location or locations to be changed for those of the logic series in which the WOM code is exhausted, the encoder storing each new codeword in the currently selected location of a respective one of the series;
   the reset circuit being triggered for those of the logic series where WOM code is exhausted for all locations in of the logic series.

4. A data processing device according to claim 1, said series of locations being one of a plurality of logical series of locations comprised in the memory, the data processing device comprising
   an address input for receiving an address value corresponding to the data;
   a series selector for selecting, under control of the address value, the series of locations operated upon by the memory selector, the data encoder and the reset circuit.

* * * * *